United States Patent
Yen

(10) Patent No.: US 6,639,228 B2
(45) Date of Patent: Oct. 28, 2003

(54) METHOD FOR MOLECULAR NITROGEN IMPLANTATION DOSAGE MONITORING

(75) Inventor: Chun-Yao Yen, Taipei Hsien (TW)

(73) Assignee: Promos Technologies Inc., Hsinchu (TW)

(*) Notice: Subject to any disclaimer, the term of this patent is extended or adjusted under 35 U.S.C. 154(b) by 52 days.

(21) Appl. No.: 10/059,714

(22) Filed: Jan. 29, 2002

(65) Prior Publication Data

US 2003/0042432 A1 Mar. 6, 2003

(30) Foreign Application Priority Data

Aug. 28, 2001 (TW) .................................. 90121169 A

(51) Int. Cl.⁷ .......................... G21G 5/00; G21K 5/10; H01L 21/336; H01L 21/76
(52) U.S. Cl. .............. 250/492.2; 250/492.21; 250/492.1; 438/308; 438/407; 438/410; 438/431; 438/452
(58) Field of Search .................. 250/492.21, 492.2; 257/640, 760, 411; 438/308, 423, 407, 410, 425, 431, 439, 450, 452

(56) References Cited

U.S. PATENT DOCUMENTS

| | | | | |
|---|---|---|---|---|
| 5,939,763 A | * | 8/1999 | Hao et al. ................ | 257/411 |
| 6,060,374 A | | 5/2000 | Lin et al. ................ | 438/514 |
| 6,110,784 A | * | 8/2000 | Gardner et al. .......... | 438/287 |
| 6,245,689 B1 | * | 6/2001 | Hao et al. ............... | 438/769 |
| 6,423,601 B1 | * | 7/2002 | Ishida et al. ............ | 438/306 |
| 6,475,887 B1 | * | 11/2002 | Kawasaki et al. ....... | 438/528 |

* cited by examiner

Primary Examiner—John R. Lee
Assistant Examiner—Mary El-Shammaa
(74) Attorney, Agent, or Firm—Birch, Stewart, Kolasch & Birch, LLP

(57) ABSTRACT

A method for estimating molecular nitrogen implantation dosage. The semiconductor wafers are first implanted with various concentration of molecular nitrogen. After implantation, the implanted wafers and a non-implanted wafer are subjected to thermal process to grow oxide layer. The thickness of oxide layer on the wafers with various implantation dosage is measured. Because implanted nitrogen on the wafers suppresses the growth of oxide layer, a suppression ratio is computed from the difference in thickness of the oxide layer between the implanted and non-implanted semiconductor wafers to stand for the thickness variation. Then, a relation between the suppression ratio and the dosages of molecular nitrogen is built. A molecular nitrogen dosage needed to grow a predetermined thickness of oxide layer on a process wafer is computed by inputting the predetermined thickness into the relation.

8 Claims, 2 Drawing Sheets

METHOD FOR MOLECULAR NITROGEN IMPLANTATION DOSAGE MONITORING

FIELD OF THE INVENTION

The present invention relates to ion implantation in semiconductor fabrication, and more particularly to evaluation of the implantation dosages of molecular nitrogen on semiconductor wafers.

BACKGROUND OF THE INVENTION

Ion implantation is commonly used for introducing foreign material into semiconductors during the manufacture of integrated circuits. The foreign atoms that are inserted into the semiconductor are dopants such as arsenic, phosphorus, and boron. The implantation dosage of those atoms is usually measured by the resistance on the wafers or by a measurement tool, such as Therma-Probe® 500 (TP500) (Therma-Wave, Inc.).

However, the resistance on the wafers after molecular nitrogen ($N_2$) implantation can be too high to be measured. Therefore, the tool, such as TP500 from Therma-Wave, Inc., is used for the measurement of the molecular nitrogen implantation concentration. However, the precision of the TP500 is not satisfied because of inherent bias.

FIG. 1 shows the relation curve between the nitrogen implantation dosage and the measured TW signal values. The TW signal values are obtained by the TP500 implantation measurement tool. Conventionally, there is inherently 3–6% deviation in measurement tool TP500. From the results shown in FIG. 1, the dosage variation is 1E12/per-TW, which means that the linear relation between the molecular nitrogen implantation dosage and the measured TW signal values are not ideal for monitoring the implantation dosage of molecular nitrogen.

Another evaluation of molecular nitrogen implantation is shown in FIG. 2. The curve in FIG. 2 represents TW signal values measured after rapid Thermal process (RTP) in various implantation voltages. The rapid Thermal process (RTP) is conducted at 1100° C. and the implantation dosage is $2E14/cm^3$. The TW signal values are still obtained by the TP500 implantation measurement tool. The relation between measured TW signal values and implantation voltages are more linearly correlated than that between the measured TW signal values and implantation dosages in FIG. 1. However, the curve in FIG. 2 is not suitable for monitoring the molecular nitrogen implantation because the actual implantation concentration will vary in different implantation voltages.

SUMMARY OF THE INVENTION

It has been one object of the present invention to provide a method to monitor the molecular nitrogen implantation dosage more precisely and non-destructively.

Another object of the present invention is to build the relation between molecular nitrogen implantation dosage and the thickness of oxide layer after thermal process.

A still further object of the present invention is to monitor the molecular nitrogen implantation using the relation between nitrogen implantation dosage and the thickness of oxide layer after thermal process.

An additional object of the present invention is to monitor the stability of the implantation tool using the relation between molecular nitrogen implantation dosage and the thickness of oxide layer after thermal process.

To achieve the above-mentioned objects, a relation between the molecular nitrogen implantation dosage and the thickness of oxide layer is built. The semiconductor wafers are first implanted with various concentrations of molecular nitrogen. After implantation, the implanted wafers and a non-implanted wafer are subjected to thermal process to grow oxide layer. The thickness of oxide layer on the wafers with various implantation dosage is measured. The implanted nitrogen on the wafers suppresses the growth of oxide layer. Therefore, the higher implantation dosage, the thinner the oxide layer on the wafers. A suppression ratio is computed from the difference in thickness of the oxide layer between the implanted and non-implanted semiconductor wafers to express the thickness variation. Then, a relation between the suppression ratio and the dosages of molecular nitrogen is built.

In one aspect of the present invention, the relation between the suppression ratio of oxide thickness and the dosages of molecular nitrogen can be used to predict the molecular nitrogen dosage needed to grow a predetermined thickness of oxide. A molecular nitrogen dosage needed to grow a predetermined thickness of oxide layer on a process wafer is estimated by inputting the predetermined thickness into the relation.

In another aspect of the present invention, the relation between the suppression ratio and the dosages of molecular nitrogen can also be used to assess the stability of an ion implanter. A monitor wafer is implanted with a predetermined molecular nitrogen dosage and then subjected to thermal process to grow an oxide layer on a surface of the monitor wafer. An estimative molecular nitrogen dosage can be computed by inputting the thickness of oxide layer on the monitor wafer into the relation. By evaluating the deviation between the estimative molecular nitrogen dosage and the predetermined molecular nitrogen dosage of the monitor wafer, the ion implanter is unstable if the deviation is larger than a specific range.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE INVENTION

In one embodiment of the present invention, a series of semiconductor wafers or chips are implanted in various dosages of molecular nitrogen. Then the implanted semiconductor wafers and a non-implanted semiconductor wafer are subjected to thermal process, such as Rapid Thermal Process or heated in a furnace, to grow oxide layer on the wafers' surface. The conditions of the non-implanted wafer are all identical to the implanted ones except for the implantation process. After the oxidation, the thickness of the oxide layer on the wafers is measured. Because the growth of oxide layer on the semiconductor wafers is suppressed by increasing implanted molecular nitrogen on the wafers, a suppression ratio of oxide layer thickness can be computed.

The suppression ratio of oxide layer thickness=1−([Tox w/$N_2$]/[Tox wo/$N_2$]) or ={([Tox wo/$N_2$]−[Tox w/$N_2$])/[Tox wo/$N_2$]}

Tox wo/$N_2$: the thickness of the oxide layer on the non-implanted wafer.

Tox w/$N_2$: the thickness of the oxide layer on the implanted wafers.

Figure 1:
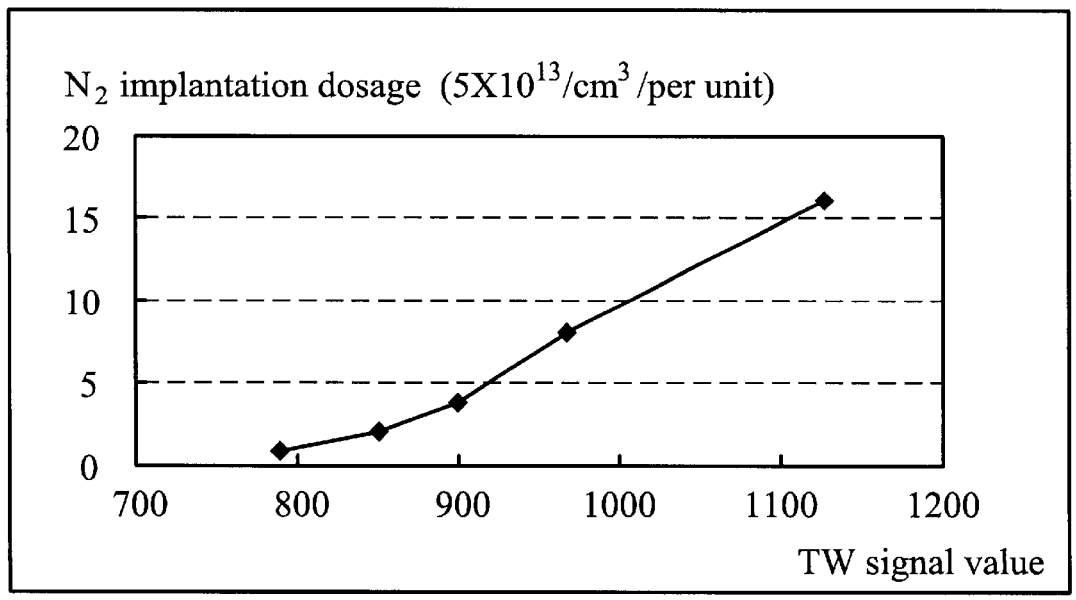
FIG. 1 shows the relation curve between the nitrogen implantation dosages and the Thermal-Wave measured values (TW signal).
Figure 2:
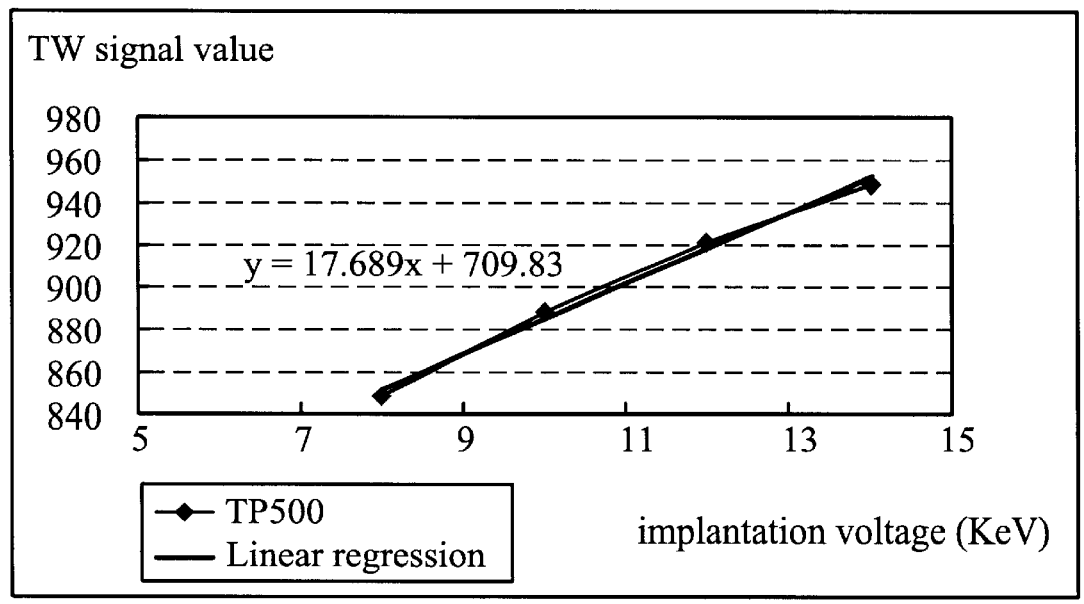
FIG. 2 shows the relation between measured TW values after rapid Thermal process(RTP) and various implantation voltages.
Figure 3:
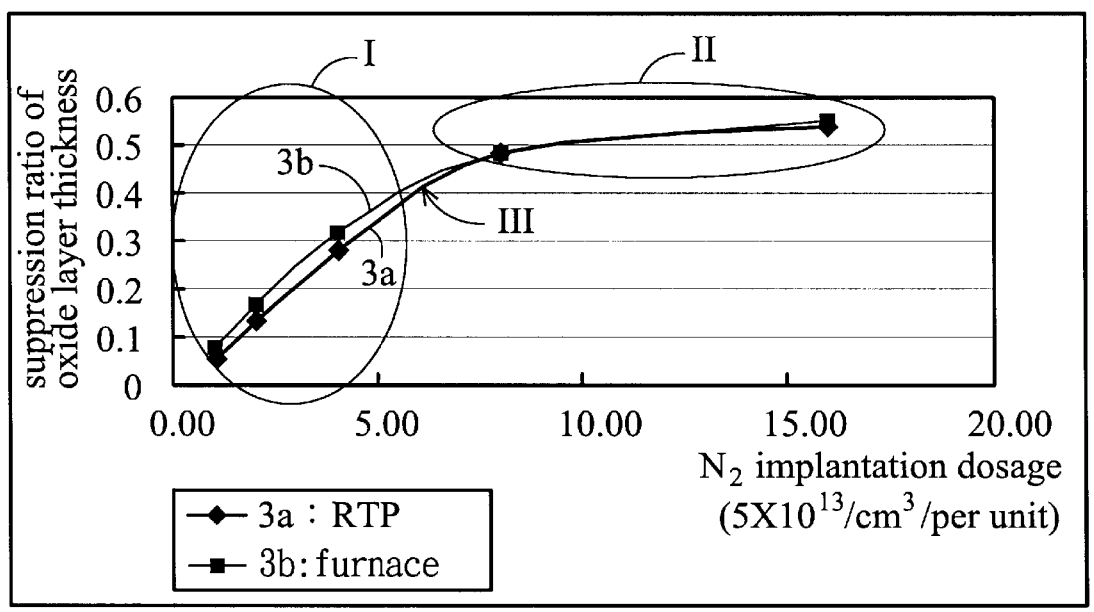
FIG. 3 shows the relation curves between the molecular nitrogen implantation dosages and suppression ratio of oxide layer on wafers according to one embodiment of the present invention.

Due to the slow oxidation rate of nitrogen, the oxide growth on the wafers is suppressed by nitrogen implantation. The suppression ratio of oxide layer thickness correlates with the implantation dosage of the molecular nitrogen. When the implantation dosage is increased, the thickness of oxide layer on the wafers will decrease. FIG. 3 shows relation curves between the molecular nitrogen implantation dosages and suppression ratio of oxide layer thickness according to one embodiment of the present invention. The x-axis represents the implantation dosages of molecular nitrogen and the y-axis represents the suppression ratio of oxide layer thickness. The curve 3a in FIG. 3 is the oxide grown by Rapid Thermal Process at 1150° C. and the curve 3b is the oxide grown in a furnace. The implantation voltage of the ion implanter in curves 3a and 3b is fixed at 12 KeV.

As the results show in FIG. 3, curves 3a and 3b are linear in area I under low implantation dosages (below 6E14/$cm^3$). When the implantation dosage of molecular nitrogen is below point III 6E14/$cm^3$, the suppression ratio of oxide layer is positively correlated with the implantation dosages. However, when the implantation dosage is too high (above 6E14/$cm^3$) as in area II, the suppression ratio of oxide layer will not increase correspondingly. The suppression ratio of oxide layer tends to become stable under high implantation dosages.

Figure 4:
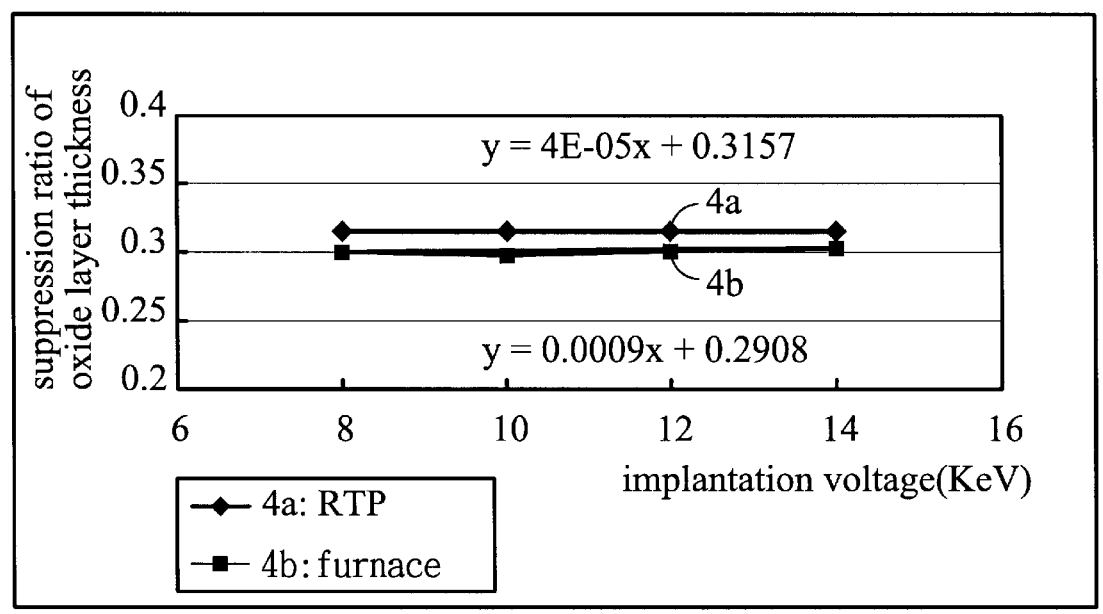
FIG. 4 shows the relation curves between the molecular nitrogen implantation voltages and suppression ratio of oxide layer on wafers according to one embodiment of the present invention.

FIG. 4 shows the relation curve between the molecular nitrogen implantation voltages and suppression ratio of oxide layer according to one embodiment of the present invention. The implantation dosage of molecular nitrogen is fixed as 2E14/$cm^3$ and the wafers are implanted under a series of implantation voltages. The x-axis in FIG. 4 represents the implantation voltages of the ion implanter and the y-axis represents the suppression ratio of oxide layer thickness. The curve 4a is the oxide grown by Rapid Thermal Process at 1100° C. and the curve 4b is the oxide grown in a furnace.

In FIG. 4, both curves 4a and 4b are linear and flat, which means that the influence of the implantation voltage variation on the suppression ratio is little. From the results shown in FIGS. 3 and 4, it is evident that the suppression ratio of oxide layer thickness is only related to the implantation dosages of molecular nitrogen, not the implantation voltages.

The above relation curves in FIG. 3 can be used to monitor the implantation dosage of molecular nitrogen. In one embodiment of the present invention, the relation between the suppression ratio and the implantation dosages of molecular nitrogen as shown in FIG. 3 is used to predict the molecular nitrogen dosage needed to grow a predetermined thickness of oxide. A molecular nitrogen dosage needed to grow a predetermined thickness of oxide layer on a process wafer is computed from the relation. A calculated suppression ratio can be obtained according to the predetermined thickness and then the implantation dosage can be interpolated from the linear area of curve 3a 3b in FIG. 3. Moreover, according to the curves 3a and 3b, if the calculated suppression ratio of the process wafer is large and therefore beyond the linear area of curve 3a or 3b, the thickness of oxide layer on the process wafer is very thin, and the minimum implantation dosage of molecular nitrogen required is 6E14/$cm^3$.

In another embodiment of the present invention, the relation between the suppression ratio and the implantation dosages of molecular nitrogen in FIG. 3 is also used to assess the stability of an ion implanter. A monitor wafer is implanted with a predetermined dosage of molecular nitrogen and then subjected to thermal process to grow an oxide layer on a surface of the monitor wafer. The thickness of the oxide layer on the monitor wafer is then measured. A suppression ratio can be computed according to the measured thickness. An estimative molecular nitrogen dosage is then computed by interpolating the suppression ratio of the monitor wafer into the relation curves in FIG. 3. The difference between the predetermined dosage and the estimative dosage of molecular nitrogen of the monitor wafer shows the deviation. The ion implanter will be taken as unstable if the deviation is larger than a specific range and the ion implanter should be suspended from further processing and then adjusted for accuracy.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for estimating molecular nitrogen implantation dosage, comprising:

implanting molecular nitrogen into a plurality of semiconductor wafers in a predetermined implantation voltage, the molecular nitrogen having a series of dosages;

subjecting the semiconductor wafers and a non-implanted semiconductor wafer to thermal process to grow an oxide layer on each surface of the semiconductor wafers;

measuring the thickness of the oxide layer on the surface of the semiconductor wafers;

computing a suppression ratio from the difference in thickness of the oxide layer between the implanted and non-implanted semiconductor wafers;

building a relation between the suppression ratio and the implantation dosages of molecular nitrogen; and computing an estimated molecular nitrogen implantation dosage needed to grow a predetermined thickness of oxide layer on a process wafer, by inputting the predetermined thickness into the relation.

2. The method as claimed in claim 1, wherein thermal process is Rapid Thermal Oxidation Process.

3. The method as claimed in claim 1, wherein the thermal process comprises processing the wafers in a furnace.

4. The method as claimed in claim 1, wherein the suppression ratio is the ratio of the oxide thickness difference between the implanted and non-implanted semiconductor wafers to the thickness of the oxide layer on the non-implanted wafer.

5. A method for assessing stability of an ion implanter, comprising:

implanting molecular nitrogen into a plurality of semiconductor wafers in a predetermined implantation voltage, the molecular nitrogen having a series of dosages;

subjecting the semiconductor wafers and a non-implanted semiconductor wafer to thermal process to form an oxide layer on each surface of the semiconductor wafers;

measuring the thickness of the oxide layer on the surface of the semiconductor wafers;

computing a suppression ratio from the oxide thickness difference between the implanted and non-implanted semiconductor wafers;

building a relation between the suppression ratio and the dosages of molecular nitrogen;

implanting a monitor wafer with a predetermined molecular nitrogen dosage;

subjecting the monitor wafer to thermal process to grow an oxide layer on a surface of the monitor wafer;

measuring the thickness of the oxide layer and computing a monitored suppression ratio from the oxides thickness difference to the non-implanted wafer;

computing an estimative molecular nitrogen dosage by inputting the monitored suppression ratio; and evaluating the deviation between the estimative molecular nitrogen dosage and the predetermined molecular nitrogen dosage of the monitor wafer, wherein the ion implanter is unstable if the deviation is larger than a specific range.

6. The method as claimed in claim 5, wherein the thermal process comprises Rapid Thermal Oxidation Process.

7. The method as claimed in claim 5, wherein the thermal process comprises processing the wafers in a furnace.

8. The method as claimed in claim 5, wherein the suppression ratio is the ratio of the oxide thickness between the implanted and non-implanted semiconductor wafers to the oxide thickness of the non-implanted wafer.

* * * * *